US006573808B1

(12) United States Patent
Burin

(10) Patent No.: US 6,573,808 B1
(45) Date of Patent: Jun. 3, 2003

(54) MILLIMETER WAVE FRONT END

(75) Inventor: Marian Mark Burin, Kirkland, WA (US)

(73) Assignee: Harris Broadband Wireless Access, Inc., Bellevue, WA (US)

(*) Notice: Subject to any disclaimer, the term of this patent is extended or adjusted under 35 U.S.C. 154(b) by 0 days.

(21) Appl. No.: 09/267,055

(22) Filed: Mar. 12, 1999

(51) Int. Cl.[7] .................................................. H03H 7/46

(52) U.S. Cl. ....................................... 333/132; 333/135

(58) Field of Search ......................... 455/32, 12.1, 313, 455/323, 78, 81, 82, 83; 333/124, 104, 137, 135, 136

(56) References Cited

U.S. PATENT DOCUMENTS 4,760,404 A * 7/1988 Ramsey ...................... 343/786
4,777,654 A * 10/1988 Conti .......................... 455/81
4,800,349 A * 1/1989 Gurcan et al. .............. 333/208
5,384,557 A * 1/1995 Yoshida et al. ........... 333/21 A
5,446,464 A * 8/1995 Feldle ........................ 342/175
5,878,331 A * 3/1999 Yamamoto et al. ......... 455/269
5,903,820 A * 5/1999 Hagstrom .................... 455/82
5,939,958 A * 8/1999 Grounds, III et al. ...... 333/204
5,982,250 A * 11/1999 Hung et al. .................. 333/26
6,049,702 A * 4/2000 Tham et al. .................. 455/78
6,342,869 B1 * 1/2002 Edvardsson et al. ........ 343/841

* cited by examiner

*Primary Examiner*—Robert Pascal
*Assistant Examiner*—Dean Takaoka
(74) *Attorney, Agent, or Firm*—Duane Morris LLP

(57) ABSTRACT

A system and method providing millimeter wave front end circuitry utilizing waveguide E-plane bandpass filters for both out of band frequency rejection as well as reverse and spurious propagation of in band signals. Accordingly, a conductive base plate is formed having various waveguides. Circuit boards of the front end circuitry are disposed in ones of the waveguides which reject in band frequencies in order to prevent undesired coupling of signals. Additionally, waveguides rejecting out of band frequencies are coupled to the circuit boards in order to provide bandpass filters utilized by the front end circuitry.

49 Claims, 7 Drawing Sheets

MILLIMETER WAVE FRONT END

RELATED APPLICATIONS

The present application is related to co-pending and commonly assigned U.S. patent application Ser. No. 08/740,332, entitled "System and Method for Broadband Millimeter Wave Data Communications" filed Nov. 7, 1996, concurrently filed, co-pending and commonly assigned U.S. patent application Ser. No. 09/267,251 , entitled "Polarization Plate" and concurrently filed, co-pending and commonly assigned U.S. patent application Ser. No. 09/267,492 , entitled "Antenna Frame Structure Mounting and Alignment", the disclosures of which are incorporated herein by reference.

TECHNICAL FIELD

The present invention relates to the transmission and reception of millimeter, or micro waves, and more particularly, to a switched or time division duplex front end providing simplified circuitry which maintains isolation between signals of the receive and transmit signal paths.

BACKGROUND

Wireless communication, including both data communication and voice communication, provides a significant amount of communication bandwidth. However, wireless communication systems often include circuitry which is very complex and costly. Moreover, often equipment must be disposed in environments where it is subject to being damaged or destroyed. For example, front end equipment may be deployed up-mast, at or near an antenna system utilized by the communication system and, thus, may be subject to loss due to lightning strikes or wind or rain damage. Additionally, as space up-mast is limited, both due to physical constraints and aesthetic considerations, such equipment must be provided in as small a package as possible, often further driving up its cost.

Another design constraint on wireless communication systems is the limited amount of available spectrum for use by the plethora of users desiring to utilize such technology. Often, in order to provide multiple users with simultaneous communication capacity, the available spectrum is divided to be allocated among such users. Often this dividing of spectrum relies upon frequency division to assign a portion of the spectrum to each such user. However, such a division of the spectrum often requires a plurality of filters and associated circuitry in order to isolate each user's signal from those of other users. This can both add to the cost of such a system as well as further compound the limited space problem described above.

Another way such spectrum may be divided for use amongst such users is to utilize time divisions of a communication signal in order to allot each user a portion of the communication carrier. However, such a time division system generally either requires frequency division in the forward and reverse links, introducing problems as described above, or adaptation to include duplex switching. Such duplex switching is generally difficult to implement as the circuitry itself is typically substantial, requiring substantial filters and circulators in order to isolate forward and reverse link signals and feedback problems associated therewith, also adding to the cost and further compounding the limited space problem.

A further disadvantage of such a time division system is often its inability to make efficient use of the available bandwidth. For example, where frequency division is relied upon to divide the forward and reverse links, one half of the available spectrum capacity may not be utilized at any one time as either the forward or reverse links will often remain idle, i.e., transmit no information, during communication in the other direction. A duplex switched system may make more efficient use of this available spectrum bandwidth, however such systems have here-to-fore been difficult to implement in broadband systems such as millimeter wave or microwave systems.

Therefore, a need exists in the art for a system and method for providing efficient use of available spectrum while providing equipment adapted to be disposed in harsh environments and environments presenting space constraints as well as to present a cost effective solution.

SUMMARY OF THE INVENTION

These and other objects, features and technical advantages are achieved by a system and method which provide a millimeter wave front end circuit which is adapted to utilize a reduced number and size of components preferably disposed in a rigid structure suitable for withstanding the environments into which it is placed. Accordingly, the front end structure of the present invention not only provides a cost effective solution, but also presents a reduced in size package agreeable with many installation scenarios.

A preferred embodiment of the present invention utilizes a rigid conductive plate structure in order to support and encapsulate the circuitry of the front end. Accordingly, the plates are formed to include cavities into which such circuitry may be disposed. By forming these cavities to be channels of predetermined dimensions waveguides may be formed to provide particular aspects of the desired circuitry without the addition of any actual components other than the plate structure itself. Preferably, the use of such waveguides according to the present invention includes waveguides tuned to be bandpass filters adapted to pass communicated frequency bands and reject out of band signals.

Moreover, to aid in isolation of forward and reverse links, as well as to provide signals having desired quality characteristics, the use of such waveguides includes waveguides tuned to be bandpass filters adapted to reject particular communicated signals. Accordingly, by disposing components of the front end circuit and/or signal paths associated therewith within these cavities, the circuits may be isolated from stray propagation of the communicated signals. The preferred embodiment of the present invention utilizes sufficiently small electronic circuitry, such as surface mount technology, in order that all, or substantially all, of this circuitry may be disposed completely within the confines of the rigid plate structure.

A preferred embodiment of the present invention utilizes the conductive nature of the plate structure in order to create microstrip transmission lines for the communication of signals. Accordingly, circuit cards composed of a dielectric material may be affixed to the plate structure such that the traces thereon in combination with the dielectric material and the underlying plate structure form a microstrip transmission line. The advantages of the microstrip transmission line are that false propagation passages may be eliminated or minimized and thus signal quality may be improved. Such an embodiment presents not only a mechanically sound structure, but also provides an inexpensive to manufacture design.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION

Figure 1:
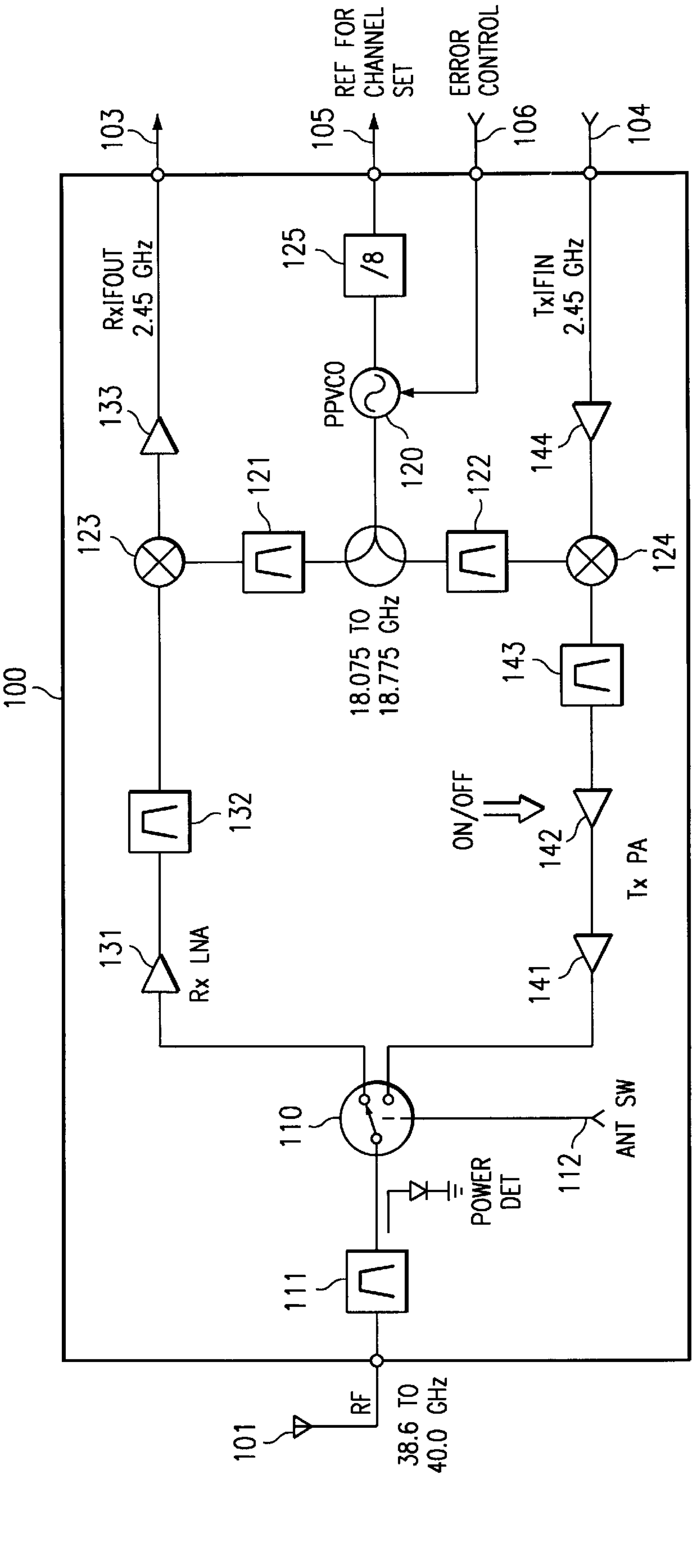
FIG. 1 shows a block diagram of a front end circuit according to a preferred embodiment of the present invention.

Directing attention to FIG. 1, a block diagram of a millimeter wave (mmWave) front end according to the present invention is shown. This mmWave front end may be deployed as part of a broadband communication system such as shown and described in co-pending commonly assigned U.S. patent application Ser. No. 08/740,332 entitled "System and Method for Broadband Millimeter Wave Data Communication" filed Nov. 7, 1996, the disclosure of which is incorporated herein by reference.

Front end circuitry module 100 is a synthesized mmWave front-end module preferably accepting and transmitting radio frequency energy in the range of 38 to 40 GHz converted to/from a mmWave front end intermediate frequency ($IF_1$), such as in the range of 2 to 3 GHz, which again may be converted to/from a cable intermediate frequency ($IF_2$), such as in the range of 400–500 MHZ, for communication with a receiving and/or transmitting device such as a broadband radio modem. In a preferred embodiment of the present invention, wherein radio frequency in the range of 38 to 40 GHz is used, $IF_1$ is preferably selected to be approximately 2.45 GHz in order to utilize bandpass filters, as described herein below, more effectively. It shall be appreciated that the 38 to 40 GHz radio frequency signal may have resonant frequencies in the pass band of the bandpass filter utilized. Accordingly, utilizing $IF_1$ of 2.45 GHz, or other frequency determined acceptable with the particular filters employed, undesired results such as image signals may be avoided. Moreover, proper selection of IF frequencies, such as the aforementioned 400–500 MHZ used in cellular communication, allows for use of commercially available components such as surface acoustic wave (SAW) filters and the like, thus reducing the cost of the overall system. Additionally, the use of multiple IFs allows for the distribution of gain at the different frequencies. For example, mmWave communications received by the front end of the present invention, may be very low power, such as in the order of −100 dBm, thus requiring substantial increases in signal strength which benefits from amplification at different frequencies to assure an overall system stability.

As shown in FIG. 1, module 100 includes an interface to transmit and receive antenna 101. In the preferred embodiment, antenna 101 is a directional microwave horn, such as a hybrid mode lens corrected horn providing approximately 32 dB of gain. Of course, depending on the situation in which the present invention is deployed and/or the carrier frequency used, the components of the antenna may be different than that stated above.

A receive signal path is provided from antenna 101 through module 100 to receive $IF_1$ output interface 103. The receive signal path of the preferred embodiment shown in FIG. 1 includes bandpass filter 111, antenna duplex switch 110, low noise amplifier (LNA) 131, bandpass filter 132, mixer 123, and amplifier 133.

Conversely, a transmit signal path is also provided from transmit $IF_1$ input interface 104 through module 100 to antenna 101. The transmit signal path of the preferred embodiment shown in FIG. 1 includes amplifier 144, mixer 124, bandpass filter 143, amplifier 142, amplifier 141, antenna duplex switch 110, and bandpass filter 111.

It shall be appreciated that mixers 123 (receive signal path) and 124 (transmit signal path), in conjunction with bandpass filters 121 and 122 and local oscillator (LO) 120 are utilized to down-convert (receive signal) and up-convert (transmit signal) between the aforementioned $IF_1$ and the communication radio frequency utilized by the system in which module 100 is deployed. Preferably LO 120 is a synthesized voltage controlled oscillator to provide for error correction of the signals associated therewith. Accordingly, module 100 includes error control interface 106 providing a coupling to a controller (not shown), which may be a general purpose processor based system operating under control of an instruction set providing functionality as described herein, adapted to monitor the signal provided by LO 120, such as through divider 125 coupled by reference interface 105. Additionally, or alternatively, module 100 may include a phase locked loop providing a stable reference oscillator which may be divided to provide a selected LO rate. Preferably bandpass filters 121 and 122 are tuned to allow a desired frequency signal generated by LO 120 to pass to the mixers while preventing undesired signals, such as harmonics of the LO signal at or near the radio frequency utilized by the system of module 100.

In the preferred embodiment, duplex switch 110 is selected so as to be capable of rapid or nearly instantaneous controlled switching between the receive and transmit signal paths. Accordingly, the mmWave front end of the preferred embodiment is specifically adapted for use not only in time division duplexing (TDD), but also in adaptive time division duplexing (ATDD), wherein time divisions may be adjusted to meet loading, such as utilizing more time divisions in the forward link and less in the reverse link when the system experiences large forward link capacity requirements.

Figure 2A:
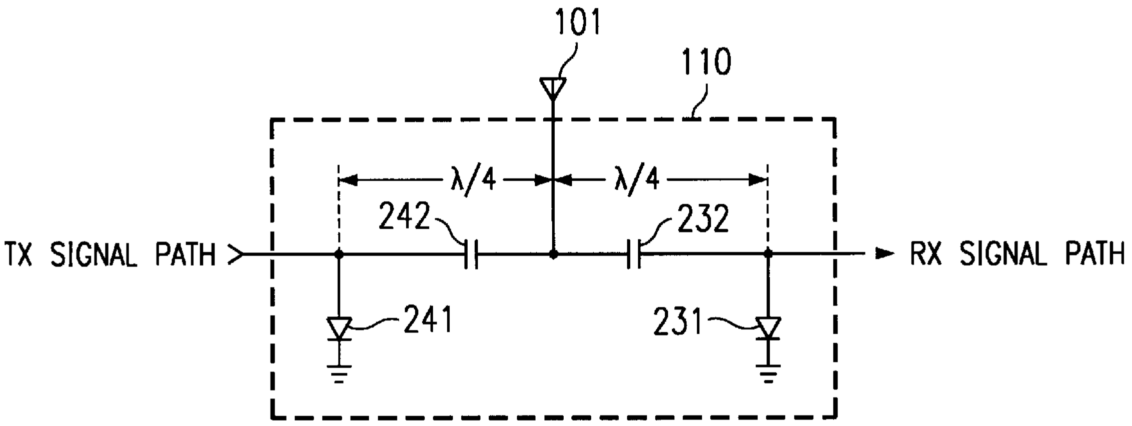
FIG. 2A shows a solid state duplex switch utilized by a preferred embodiment of the present invention.

In a preferred embodiment, duplex switch 110 is a microwave monolithic integrated circuit (MMIC). As shown in FIG. 2A, the MMIC may include a diode and capacitor combination in the receive signal path (diode 231 and capacitor 232) and a diode and capacitor combination in the transmit signal path (diode 241 and capacitor 242) to form a single shunt diode switch. In order to provide switching wherein undesired signal characteristics are not experienced, such as reflected or standing waves, the diodes used in switching the signals are disposed a predetermined fraction of a wavelength of the signals to be switched from a point at which the signals are coupled with the switching circuitry. In the preferred embodiment illustrated the diodes are disposed ¼ of a wavelength ($\lambda/4$) from the intersection of the receive and transmit signal paths.

Preferably diodes 231 and 241 are PIN diodes providing resistance as a function of the current conducted there through, i.e., at full current the diode represents almost a short circuit, with a reduced current the diode is a resistor, and with no current the diode presents a very high impedance. Therefore, by biasing the diodes, such as applying a sufficient forward bias across diode 241 and a reverse bias across diode 231, duplex switch 110 may be controlled to couple signals of the receive signal path to antenna 101. Likewise, by biasing diode 241 reversely and diode 231 in the forward direction duplex switch 110 may be controlled to couple signals of the transmit signal path to antenna 101.

Figure 2B:
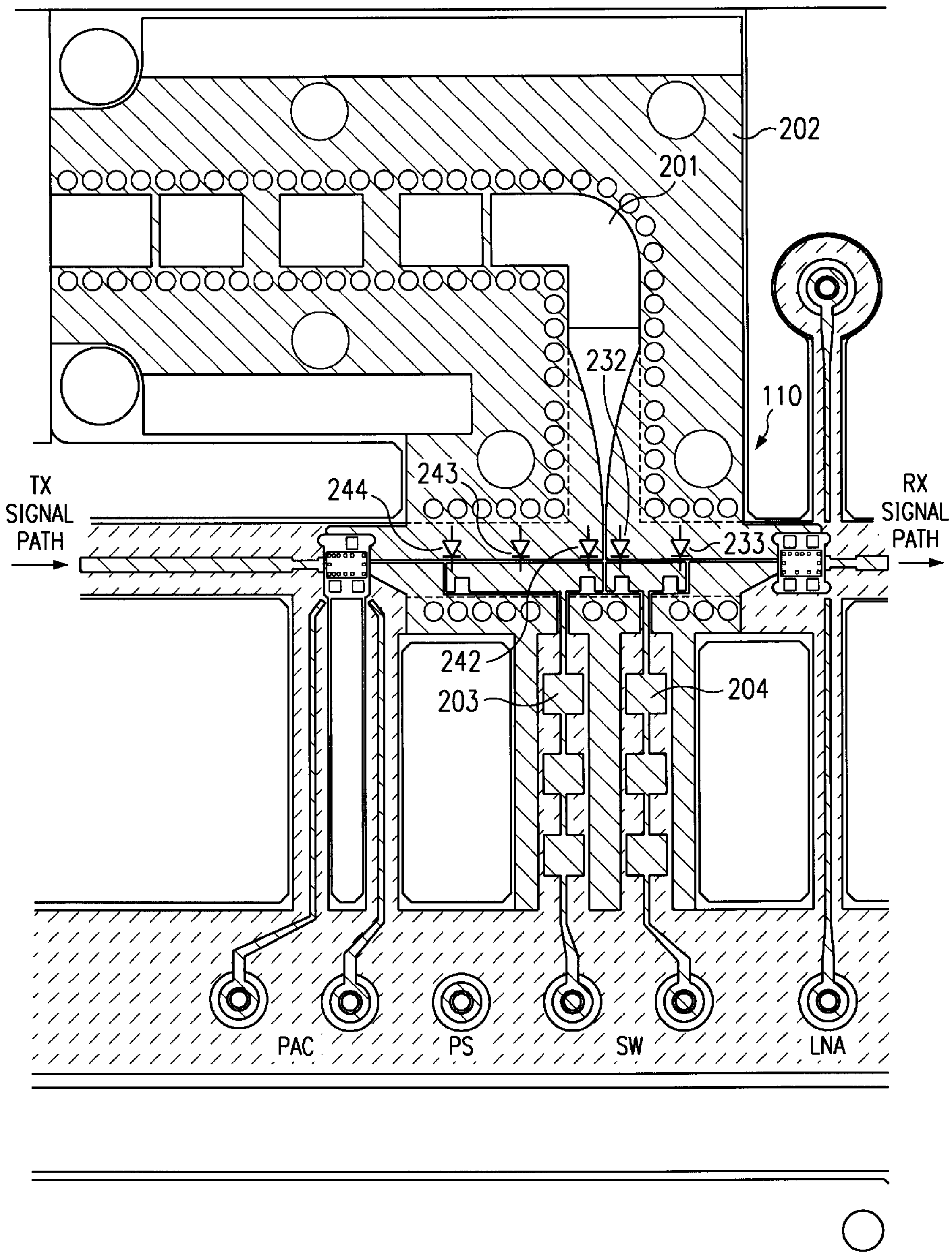
FIG. 2B shows a solid state duplex switch utilized by an alternative preferred embodiment of the present invention.

Depending on the particular system in which the mmWave front end of the present invention is utilized, high order isolation between signals of the transmit and receive signal paths may be desired or critical. Accordingly, a multiple shunt diode switch as shown in FIG. 2B may be desired. According to this preferred embodiment, wave guide 201, coupled to a mmWave antenna, is coupled to a "T" junction. One path of the "T" junction is coupled to the transmit signal path of the mmWave front end and the other path of the "T" junction is coupled to the receive signal path of the mmWave front end. Diodes 242, 243 and 244, preferably PIN diodes, are disposed across a gap in foil conductor 202 and foil conductor 203 and diodes 232 and 233, also preferably PIN diodes, are disposed across a gap in foil conductor 202 and foil conductor 204 crossing the wave guide in an E-plane split as is described in further detail below with respect to the E-plane filters. Accordingly, by properly biasing the diodes either the transmit or receive signal paths may be shorted. For example, by applying sufficient forward bias across diodes 242, 245 and 244 and applying a reverse bias across diodes 232 and 233, such as at the SW inputs of FIG. 2B, duplex switch 110 may be controlled to couple only signals of the receive signal path to antenna 101.

Experimentation has revealed that use of the multiple shunt diodes provides better isolation than the single MMIC switch of FIG. 2A. For example, approximately 40 dB of isolation has been achieved utilizing three diodes. Isolation on the order of 50 dB, desirable in high speed data communications, may be achieved utilizing arrangements of four to five diodes in the switch. Additionally, it shall be appreciated that the proper placement of such diodes also affects the switch characteristics. Preferably, the diodes in each of the receive and transmit signal paths are spaced from one another approximately ½ of a wavelength (½ $\lambda$).

Antenna switch input 112, shown in FIG. 1, may be used to provide selected biases, such as by the aforementioned controller (not shown), to diodes 231 and 241 of the embodiment of FIG. 2A or diodes 232, 233, 242, 243, and 244 of the embodiment of FIG. 2B in order to provide switching as described above. Moreover, as the PIN diodes of the preferred embodiment provide controlled impedance as a function of current flowing there through, provision of predetermined levels of bias voltage may be utilized to adjust attenuation of the receive and transmit path signals, e.g., a +0.7 volt bias may be equated with 10 dB of attenuation.

In order to further isolate the signals of the transmit and receive signal paths, the preferred embodiment of the present invention switches off the transmitter during receive time periods. Therefore, the receive noise may be kept at the thermal noise floor as there is no transmitter gain to amplify the noise present in that portion of the signal path. A further advantage of the switched operation of the transmitter according to the present invention is that what is generally the highest power consumer of the system may be operated at a approximately a 50% duty cycle (a 50% duty cycle for standard TDD and a variable duty cycle, but generally less than 100%, for ATDD).

Figure 3:
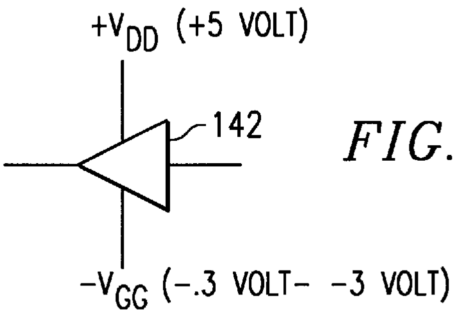
FIG. 3 shows a transmitter amplifier switchable according to a preferred embodiment of the present invention.

Directing attention to FIG. 3, transmission signal power amplifier 142 is shown adapted according to the present invention in order to provide switched transmitter operation suitable for use in TDD or ATDD. Switching of amplifier 142 is provided by driving the gate voltage VGG down rapidly, such as from −0.3 Volt to −3 Volts. Although switching could be provided by adjusting the $+V_{DD}$ voltage, typically a power supply would not react as quickly as when driving down the negative voltage as large capacitors associated with the power supply could absorb the change in voltage and, therefore, slow the transition. As the time bursts of a TDD or ATDD system are generally very short, on the order of 0.25 msec, this delay in switching the transmitter amplifier may result in system performance degradation.

In the preferred embodiment of the present invention, the mmWave front end is disposed at, or very near, the antenna structure. Accordingly, this equipment may be disposed in a location which is limited in space and/or mass as well as being disposed in an environment having harsh conditions associated therewith, such as at the distal end of an antenna mast extended to a desired altitude. Accordingly, it is desired to provide the mmWave front end in a small package adapted to withstand the rigors of a harsh environment.

Figure 4:
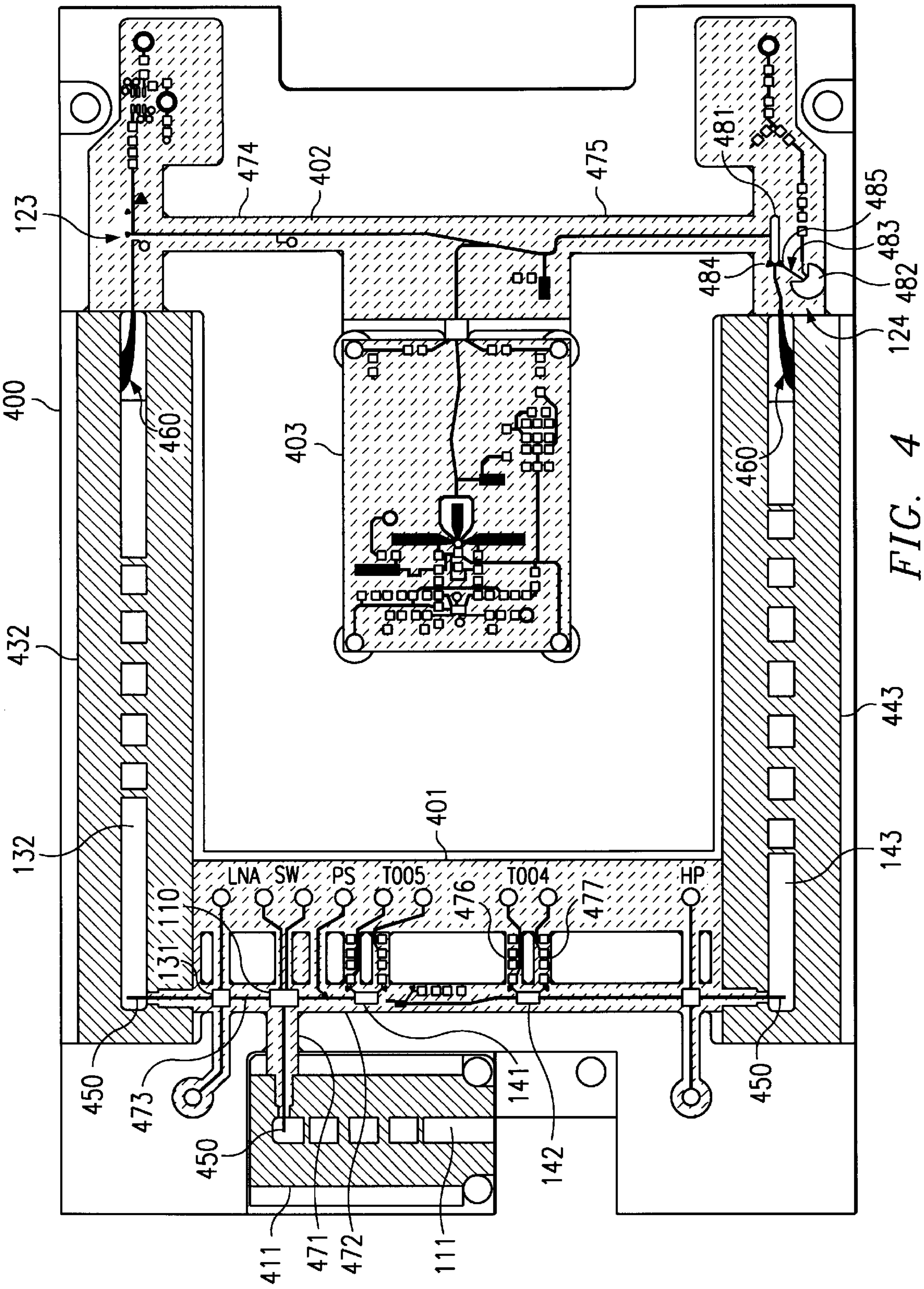
FIGS. 4 and 5 show alternative embodiments of the front end circuitry of the present invention.
Figure 5:
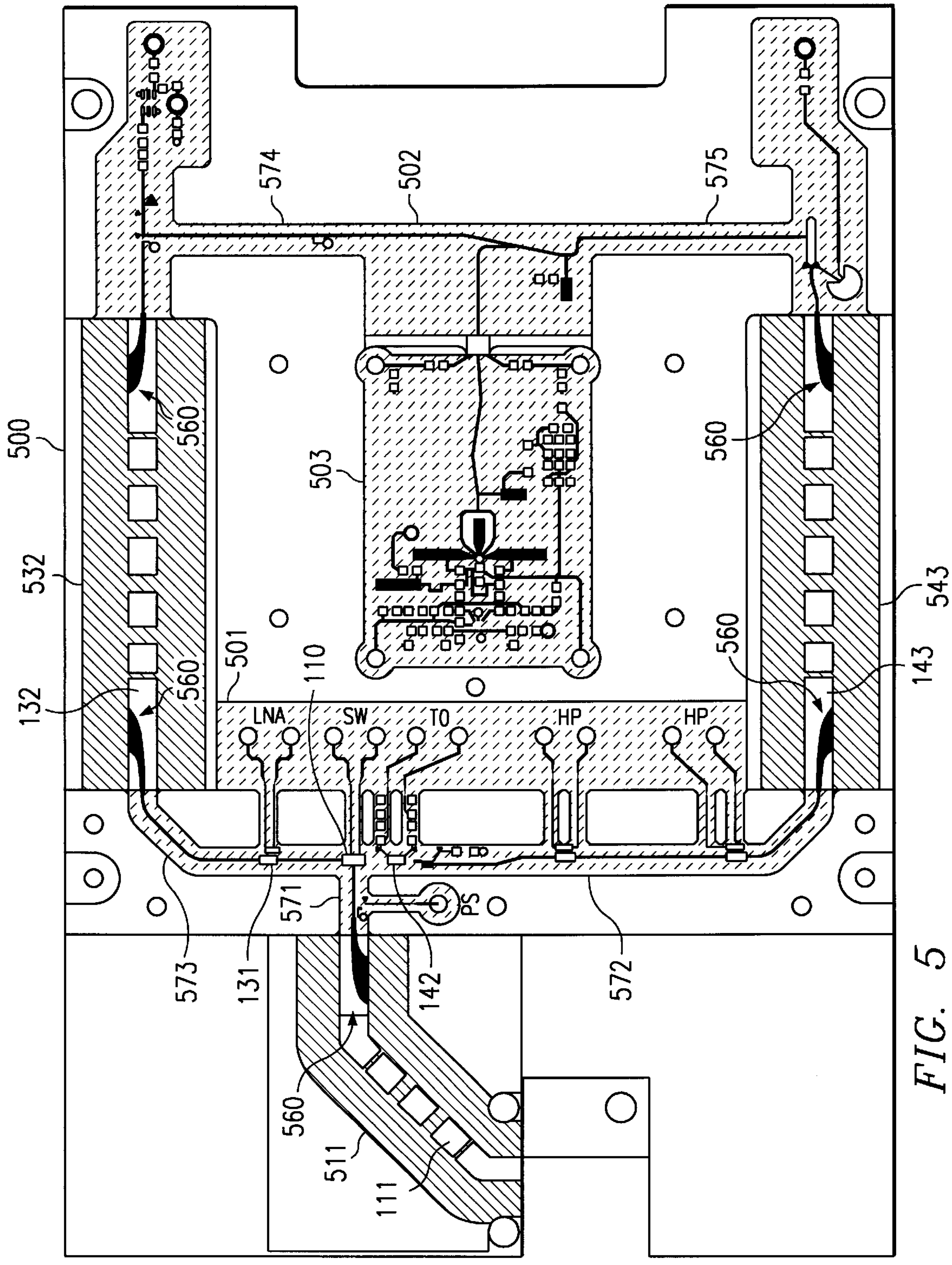

Directing attention to FIGS. 4 and 5, alternative embodiments of the mmWave front end circuitry of FIG. 1 is shown. Referencing FIG. 4, plate 400 providing a structural basis for the mmWave front end of this embodiment is shown. Plate 400 may be made of any material providing the desired structural integrity. However, because portions of plate 400 are utilized as ground planes and/or wave guides, as will be described in detail below, the preferred embodiment of plate 400 includes an aluminum, or other conductive material, plate milled, or otherwise formed, to provide channels or cavities in which componentry of the present invention may be disposed. Of course, plate 400 may be made of materials other than conductive materials, such as a composite material, where, for example, a conductive coating are applied to provide desired properties.

It shall be appreciated that plate 400 shown in FIG. 4 is only a portion of that utilized to incarcerate the circuitry of the preferred embodiment. Preferably, a second corresponding plate or combination of plates is utilized to interface with plate 400 to define Faraday cages and/or wave guides as described herein with an E-plane split (the interface between the two plates) suitable for allowing access, to the componentry of the mmWave front end as well as to allow disposing of conductive material there between for use in the above mentioned TDD multiple shunt switch and the below mentioned E-plane filters. Of course, a plate corresponding to plate 400 may be of a design different than that of plate

400, such as where plate 400 substantially defines three sides of the wave guides and only a fourth side provided by a planar plate is required of the corresponding plate.

Figure 8:
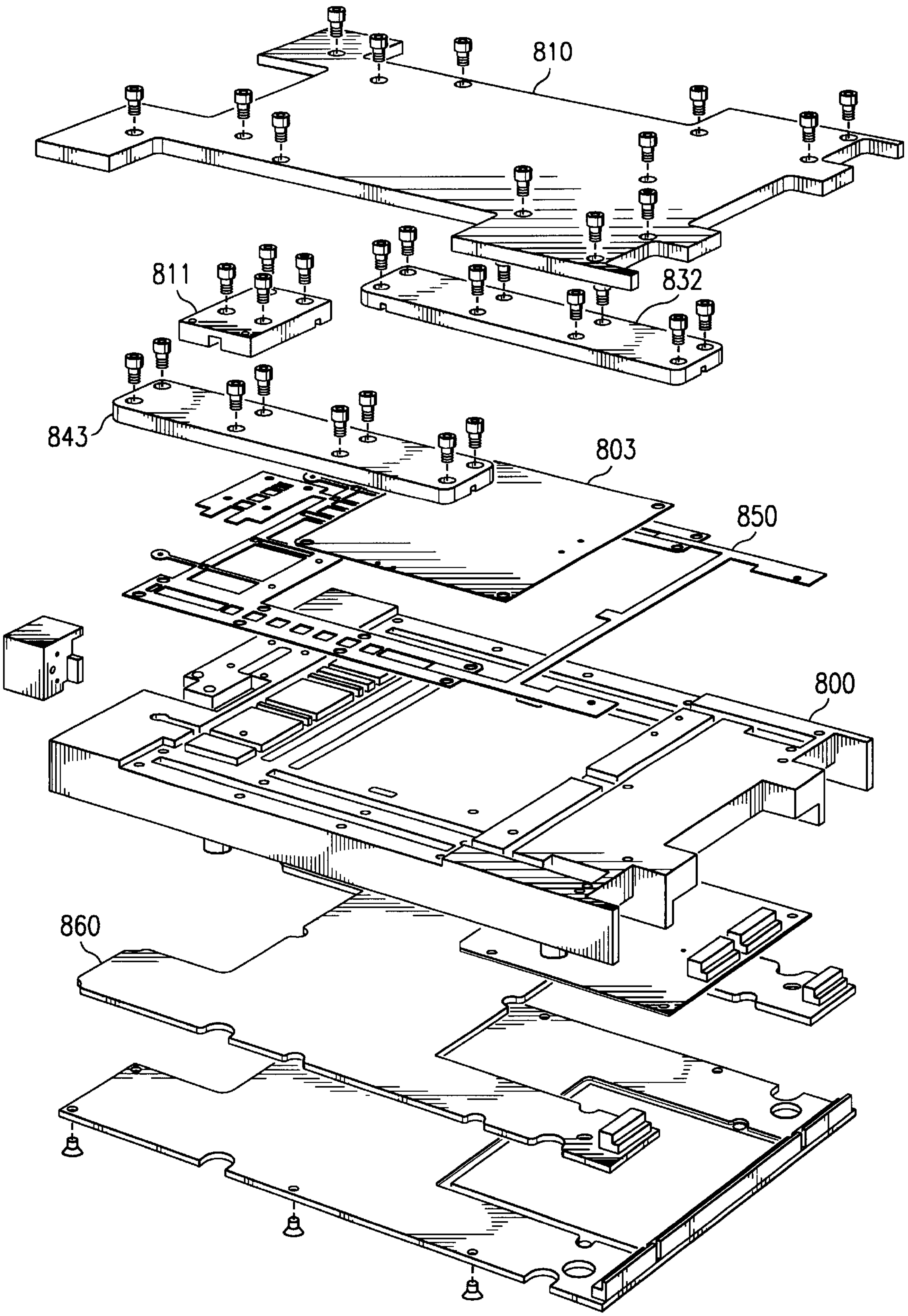
FIG. 8 shows an isometric exploded view of front end circuitry of the present invention including a base plate, dielectric, and top plates.

Directing attention to FIG. 8, an isometric view of an exploded mmWave front end of the present invention is shown including the above described base plate, base plate 800, and corresponding combination of top plates, plates 810, 811, 832 and 843. It shall be appreciated that plates 811, 832, and 845 provide a portion of a wave guide such as corresponds to wave guides 111, 132 and 143 or FIG. 4. Plate 810 provides a covering surface, such as may provide a completed Faraday cage, to provide electrical shielding as described in more detail herein below, for circuitry disposed on dielectric sheet 850 (preferably containing circuitry such as that of circuit ends 401 and 402 and E-plane filters described above) and/or dielectric sheet 803 (preferably containing circuitry such as that of circuit card 403 described above). Additional circuitry may be housed in the plates of the present invention, such as circuit card 860 shown disposed below base plate 800, if desired.

In order to provide bandpass filters utilized by the present invention in a cost effective manner and which are suitable for disposition in small area likely to be disposed in a harsh environment, bandpass filters 111, 132, and 143 are embodied in E-plane filters provided by waveguides formed into plate 400. As described above, that a plate corresponding to plate 400 is utilized in juxtaposition with plate 400 in order to complete the waveguides shown in FIG. 4. However, this corresponding plate is not shown in order to expose the components of the mmWave front end that would otherwise be obscured by its disposition in juxtaposition with plate 400.

The waveguide bandpass filters 111, 132, and 143 of FIG. 4 are preferably E-plane filters, such as may be formed from rectangular slots or channels in plate 400, selected so as to provide cutoff frequencies suitable in discriminating between the RF signals communicated by the system and out of band frequencies. The forming of a waveguide E-plane bandpass filter suitable to pass a selected frequency band is well known in the art and, therefore, will not be discussed in detail herein.

In order to introduce and/or accept signals to/from the waveguide bandpass filters and/or microstrips or other conductors, various methods may be used including the use of capacitive inductive coupling. Preferably, where the direction of propagation of signals conducted by the waveguide bandpass filter is at an angle with respect to a signal path coupled thereto, capacitive probe transitions are utilized to introduce and/or accept signals to/from the waveguide. Accordingly, as shown in FIG. 4, capacitive probes 450 are utilized to introduce and/or accept signals to/from at least one end of waveguide bandpass filters 111, 132, and 143. However, where the direction of propagation of signals conducted by the waveguide bandpass filter is not at an angle with respect to a signal path coupled thereto, inductive coupling is preferably used. Accordingly, as shown in FIG. 4, exponential E-plane transitions 460 are utilized as inductive couplings at one end of each of waveguide bandpass filters 111, 132, and 143.

Referencing FIG. 5, another preferred embodiment of the circuitry of FIG. 1 is shown. In this embodiment, plate 500, substantially corresponding to plate 400 described above with respect to FIG. 4, again includes bandpass filters 111, 132, and 143 embodied in waveguides milled, or otherwise formed, into plate 500. As with plate 400 discussed above, it shall be appreciated that a plate corresponding to plate 500 is utilized in juxtaposition with plate 500 in order to complete the waveguides shown in FIG. 5. However, this corresponding plate is not shown in order to expose the components of the mmWave front end that would otherwise be obscured by its disposition in juxtaposition with plate 500.

The waveguide bandpass filters 111, 132, and 143 of FIG. 5, as with those of FIG. 4, are preferably E-plane filters, such as may be formed from rectangular slots or channels in plate 500, selected so as to provide cutoff frequencies suitable in discriminating between the RF signals communicated by the system and out of band frequencies. However, waveguide bandpass filter 111 and microstrip channel guides 573 and 572 of FIG. 5 include bends in order to redirect the signals conducted thereby. Accordingly, each interface of the waveguide bandpass filters is provided without an angle being presented with respect to the direction of propagation of signals conducted by the waveguide bandpass filter and a signal path coupled thereto. Therefore, at each of the interfaces between the waveguide bandpass filters of FIG. 5 and the microstrip circuitry coupled thereto, inductive couplings are preferably used. As shown in FIG. 5, exponential E-plane transitions are utilized as inductive couplings at all interfaces of waveguide bandpass filters 111, 132, and 143.

Figure 6:
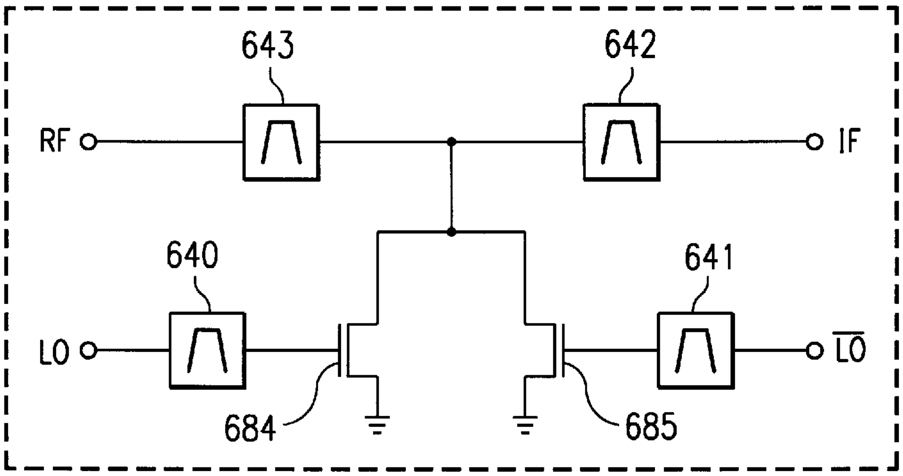
FIG. 6 shows a block diagram of a mixer utilized by a preferred embodiment of the present invention.
Figure 7:
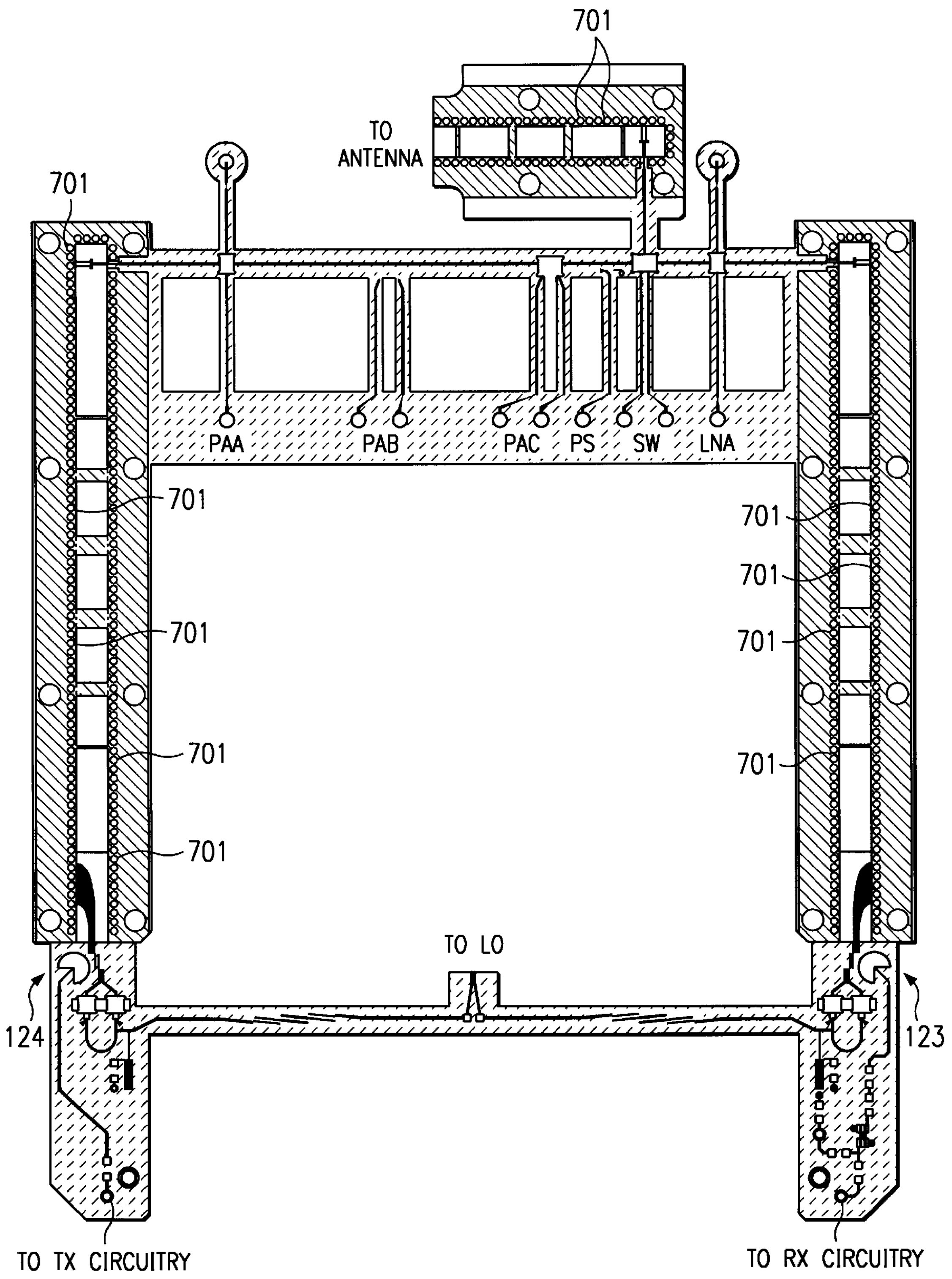
FIG. 7 shows a preferred embodiment of the foil conductors provided on a dielectric as used in the front end circuitry of FIGS. 4 and 5.

In the preferred embodiment of the present invention, the waveguide bandpass filters 111, 132, and 143 each include a thin layer of a conductive material, such as a metal foil, preferably laminated on a thin layer of dielectric material for structural integrity (foil 411, 432, and 443 shown in FIG. 4 and foil 511, 532, and 543 shown in FIG. 5 respectively) having openings of predetermined sizes disposed therein defining resonators in order to provide a multi-pole filter having sharper frequency characteristic. This laminated structure is disposed upon plates 400 and 500 such that the portion of the dielectric material with the openings therein extend over the waveguide channel formed in plates 400 and 500. Accordingly, when the aforementioned plates corresponding to plates 400 and 500 are placed in juxtaposition therewith, foil 411, 432, and 443 and foil 511, 532 and 543 respectively are disposed in the center of the wider side of the wave guides formed. In order to maintain electrical continuity between the plates held in juxtaposition with the preferred embodiment foil on dielectric material plated through vias provided along the length of the wave guides in the foil and dielectric components as shown by the small circular vias 701 of FIG. 7. It shall be appreciated that the preferred embodiment of the laminated structures of FIGS. 4 and 6 also include vias as shown in FIG. 7, although such vias have been omitted from those FIGURES.

It should be appreciated that higher order filters provide sharper cutoff frequencies. Accordingly, in a preferred embodiment, where the local oscillator utilized to up-convert an IF to the communicated RF may provide images or harmonics at or near the frequency band to be passed, waveguide bandpass filter 143 may include a larger number of resonators represented by openings, as shown in FIG. 4, in order to provide a very sharp cutoff frequency in order to substantially eliminate such images and harmonics from the transmitted signal. Accordingly, the filters such as wave guide band pass filter 143 provide image rejection as well as suppressing unwanted frequencies such as LO utilized in up/down conversion of frequencies. The use of higher order filters to improve the cutoff characteristics is well known in the art and, therefore, will not be discussed in detail herein.

It shall be appreciated that, although bandpass filters 111, 132, and 143 are shown and described as a rectangular waveguide in the embodiments of FIGS. 4 and 5, other configurations may be utilized according to the present invention. For example, a cylindrical waveguide and/or microstrip or stripline filters may be used. Likewise, for wide band applications, a ridged waveguide may be used.

Regardless of the specific configuration of the waveguides utilized according to the present invention, it should be appreciated that a mmWave front end as shown in FIGS. 4 and 5 provides for the filtering, conversion and amplification of received and transmitted signals by utilizing a plate which contains and protects all the electronic components and signal paths of the mmWave front end from the environment in which they are disposed without adding complex interconnections, isolators, and/or adaptors. Accordingly, the embodiment of FIGS. 4 and 5 provides an efficient use of materials and space to provide the functionality of the mmWave front end block diagram of FIG. 1.

Still referring to FIGS. 4 and 5, circuitry containing active components of the mmWave front end of the preferred embodiment of the present invention are shown disposed on printed circuit boards. Specifically, circuit cards 401, 402, and 403 are shown disposed in plate 400 of FIG. 4. Likewise, circuit cards 501, 502, and 503 are shown disposed in plate 500 of FIG. 5. The preferred embodiment of the present invention utilizes recesses milled, or otherwise formed, into plates 400 and 500 in order to accept and securely contain the printed circuit boards and their active components. Accordingly, when the corresponding plate is placed in juxtaposition with plates 400 and 500, a mmWave front end unit adapted to be deployed in harsh environments is provided.

It should be appreciated that the circuit cards of the preferred embodiment of the present invention provide a simple means by which circuitry may be manufactured and subsequently disposed in the casing of the mmWave front end. Moreover, as the circuit board itself is non-conductive, i.e., a dielectric, and plates 400 and 500 of the preferred embodiment are conductive in order to provide the waveguides as described herein, the signal paths utilized are preferably microstrips. Accordingly, the circuit cards utilized are preferably a very thin dielectric material in order to reduce radiation from the microstrip conductor. Preferably, the circuit boards are epoxied, or otherwise held tightly against a bottom wall of the channels within plates 400 and 500, so that a microstrip ground plane which is integrated with the chassis is provided. The width of the channel is preferably selected such that the channel forms a waveguide below cutoff for the frequency band of interest (i.e., 38.6–40.0 GHz). Such an embodiment provides both good mechanical structure as well as preventing unwanted reverse propagation of the signal. Rather than providing a microstrip, an additional dielectric plate can be utilized to provide a stripline transmission line, if desired.

Of course, operation according to the present invention may be accomplished without the use of printed circuit boards if desired. For example, a dielectric material may be directly deposited on the plates or other ground plane provided and thereafter conductors may be deposited thereon. Likewise, individual conductors, such as in the form of an insulated solid core or stranded wire may be utilized. However, it shall be appreciated that such an embodiment may forgo the advantages of the microstrip or stripline transmission lines.

Moreover, as plates 400 and 500 are adapted to provide for the formation of waveguides utilized as the aforementioned bandpass filters, the recesses, or portions thereof, containing the circuitry and signal paths utilized by the mmWave front end of the present invention preferably include channels (channels 471–475 of FIG. 4 and channels 571–575 of FIG. 5) which are also adapted to be waveguides. However, unlike the waveguides utilized as E-plane bandpass filters 111, 132, and 143, the waveguides formed around the active circuitry and signal paths of the mmWave front end are preferably rectangular slots or channels in plates 400 and 500 having dimensions, corresponding to the wave lengths of the signals to be passed, selected so as to provide a waveguide below the cutoff of the signals to be passed. This structure provides an effective mean of suppression of the reverse signal propagation, specifically an undesired feedback from the high gain RF amplifiers. Accordingly, the use of additional circuitry which may be large and/or expensive, such as ferite circulators and isolators, may be avoided while still providing a very stable RF structure.

It shall be appreciated that the preferred embodiment of the present invention, in addition to placing components disposed along the signal paths of the mmWave front end of the present invention, as well as the signal paths themselves, in waveguides adapted to reject certain frequency bands, so too may individual components be placed within such waveguides. For example, discrete transistors of amplifier 142 in the embodiment of FIG. 4 are disposed in waveguides 476 and 477 respectively. Moreover, these waveguides may be adapted to reject different frequency bands than those of the other waveguides utilized in the mmWave front end, as shown by waveguides 476 and 477 being substantially more narrow than wave guide 472, for example.

Moreover, as with the waveguides associated with individual components discussed above, ones of these waveguides may be adapted to reject different frequency bands than those of the other waveguides utilized in the mmWave front end in order to reject specific undesired stray signals or frequencies which may be present at particular portions of the circuitry. For example, the waveguides associated with the propagation of intermediate frequencies according to the present invention may be adapted to reject different frequencies than the waveguides associated with the propagation of radio frequencies according to the present invention.

In an alternative embodiment of the present invention, the channels in which the signal paths of the circuit boards are disposed may be continually reduced in size in order to present a channel which is inoperative to pass any, or substantially any, signals other than those propagated by the signal paths of the printed circuit boards. Accordingly, rather than a waveguide adapted to reject particular frequency bands, these channels may be adapted so as to substantially pass no frequencies in the RF, LO and IF range.

In addition, or in the alternative, to the aforementioned waveguides, the present invention may utilize conductive surfaces surrounding circuitry and/or components of the mmWave front end to provide electric screening, such as by providing cavities within the plates to form Faraday cages. For example, although providing components upon a portion of a circuit card too large to be disposed within an attenuation waveguide as described above, circuit boards 403 and 503 may be disposed in a cavity of plates 400 and 500, which when mated with a corresponding conductive plate, substantially provides an electronic shield around this circuitry. Thus unwanted coupling between this circuitry and external circuitry or signals may be avoided or substantially reduced.

In the preferred embodiment, mixers utilized to up-convert and/or down convert signals include subharmonically pumped FET resistive mixers. For example, mixer 124 shown in FIG. 1 in the preferred embodiments shown in FIGS. 4 and 5 is a FET resistive mixer as illustrated in FIG. 6. The FET resistive mixer shown in FIG. 6 includes LO bandpass filters 640 and 641, IF bandpass filter 642, RF signal bandpass filter 643, and FETs 684 and 685. As provided in the preferred embodiment of FIG. 4, waveguide bandpass filter 143 corresponds to RF signal bandpass filter 643, and transistor 484 and transistor 485 correspond to FETs 684 and 685 respectively. The circuitry of circuit board 403 provides an oscillator for providing the LO signal as well as bandpass filtering of this signal corresponding to bandpass filters 640 and 641. As circuits for providing a oscillator signal of a desired frequency for up-converting and/or down-converting signals are well known in the art, a detailed description of such circuitry will not be provided herein. In the embodiment of FIG. 4, the signal LO and $\overline{\text{LO}}$ are provided from a single oscillator signal through the use of loop 481 providing a 180° phase delay as between the LO signal provided to transistor 485 as compared to that provided to transistor 484. Bandpass filter 642 is provided by a capacitor 482 formed from a 270° radial stub coupled to the IF signal path and inductor 483 formed from a bond wire connected between capacitor 482 and transistors 484 and 485.

It shall be appreciated that this embodiment of a FET resistive mixer results in an efficient, in both cost and space utilized, method of providing mixing circuitry suitable for up-converting and/or down-converting signals as utilized by the present invention. Specifically, the FET resistive mixer of this embodiment requires reduced componentry as portions thereof are simply formed as a part of the circuit board or its connecting wires. Moreover, by utilizing surface mount technology for the transistors they may be effectively embedded into waveguide channels and/or Faraday cavities of plates 400 and 500 as described above.

Mixers other than the above described FET mixer may be utilized according to the present invention, if desired. For example, the mixer illustrated in the Rx signal path of FIGS. 4 and 5 (mixer 123) is a diode mixer. Of course, both mixers may utilize similar componentry as shown by the FET mixers (mixers 123 and 124) of FIG. 7.

Although preferred embodiments described herein have been with reference to millimeter waves, it shall be appreciated that the present invention may be adapted to be utilized with a variety of wavelength carriers.

Although the present invention and its advantages have been described in detail, it should be understood that various changes, substitutions and alterations can be made herein without departing from the spirit and scope of the invention as defined by the appended claims.

What is claimed is:

1. A system for providing duplexed transmission and reception of communication signals, said system comprising:

a duplex switch interfacing a common signal path with a receive signal path and a transmit signal path;

a structure encapsulating said duplex switch and at least a portion of each of said common signal path, said receive signal path, and said transmit signal path;

a filter disposed in said receive signal path, wherein said receive filter is at least in part provided by said structure;

a filter disposed in said transmit signal path, wherein said receive filter is at least in part provided by said structure; and wherein at least one of said receive filter and said transmit filter is a waveguide filter formed in said structure and tuned to pass a radio frequency utilized according to said system.

2. The system of claim 1, wherein said duplex switch is disposed at lease in part in said receive signal path and at least in part in said transmit signal path, and wherein said duplex switch is a multiple shunt diode switch.

3. The system of claim 1, wherein said waveguide filter is an E-plane bandpass filter including a conductive material disposed therein to improve the cutoff characteristics of said waveguide filter.

4. The system of claim 1, wherein capacitive coupling is utilized to interface a signal from a microstrip to be passed by said E-plane bandpass filter.

5. The system of claim 1, wherein an inductive coupling is utilized to interface a signal from a microstrip to be passed by said E-plane bandpass filter.

6. The system of claim 5, wherein said inductive coupling is provided by at least one inductive exponential transition coupling said E-plane bandpass filter to another portion of said system.

7. The system of claim 1, further comprising:

a filter disposed in said common signal path, wherein said common filter is at least in part provided by said structure.

8. The system of claim 7, wherein said common filter is a waveguide filter formed in said rigid structure and tuned to pass a radio frequency utilized according to said system.

9. The system of claim 8, wherein said waveguide filter is an E-plane bandpass filter including a conductive material disposed therein to improve the cutoff characteristics of said waveguide filter.

10. The system of claim 7, wherein capacitive coupling is utilized to interface a signal from a microstrip to be passed by said E-plane bandpass filter.

11. The system of claim 7, wherein an inductive coupling is utilized to interface a signal from a microstrip to be passed by said E-plane bandpass filter.

12. A system for providing duplexed transmission and reception of communication signals, said system comprising:

a duplex switch interfacing a common signal path with a receive signal path and a transmit signal path;

a structure encapsulating said duplex switch and at least a portion of each of said common signal path, said receive signal path, and said transmit signal path;

a filter disposed in said receive signal path, wherein said receive filter is at least in part provided by said structure;

a filter disposed in said transmit signal path, wherein said receive filter is at least in part provided by said structure; and wherein at least one of said receive filter and said transmit filter is a waveguide filter formed in said structure and tuned to pass a radio frequency utilized according to said system; and wherein said structure comprises:

a first conductive plate having a plurality of cavities formed therein, wherein a first cavity is of a predetermined size and shape to form a waveguide utilized as said receive filter, and wherein a second cavity is of a predetermined size and shape to form a waveguide utilized as said transmit filter; and a second conductive plate adapted to mate with said first conductive plate and thereby substantially enclose ones of said plurality of cavities.

13. The system of claim 12, wherein said plurality of cavities include:

a third cavity having a conductor material disposed therein electrically isolated from said first conductor plate by a dielectric material affixed substantially adjacent to a surface of said cavity, wherein said conductor material forms at least a portion of one of said receive signal path and said transmit signal path.

14. The system of claim 13, wherein said conductor material, said dielectric material, and said first conductive plate form a microstrip transmission line.

15. The system of claim 13, wherein said conductor material, said dielectric material, and said first conductive plate form a portion of a stripline transmission line.

16. The system of claim 13, wherein said third cavity is of a predetermined size and shape to discourage propagation of communication signals except by said conductor material.

17. The system of claim 16, wherein said third cavity is a waveguide utilized as a filter to reject reverse propagation of communication signals.

18. The system of claim 17, wherein said third cavity provides smooth bends to provide a non-angular interface with at least one of said receive filter waveguide and said transmit filter waveguide.

19. The system of claim 17, wherein said duplex switch is disposed in said third cavity.

20. The system of claim 19, wherein said duplex switch is a microwave monolithic integrated circuit.

21. The system of claim 17, further comprising:

a mixer circuit disposed in one of said receive signal path and said transmit signal path, wherein said mixer circuit is adapted to convert communication signals between a first frequency and a second frequency, and wherein said mixer circuit is disposed in said third cavity.

22. The system of claim 21, wherein said mixer comprises:

a capacitor formed from at least a portion of said conductor material; and an inductor formed from bond wire coupled to said conductor material.

23. The system of claim 21, further comprising:

a fourth cavity having a conductor material disposed therein electrically isolated from said first conductor plate by a dielectric material affixed substantially adjacent to a surface of said cavity, wherein said conductor material forms at least a portion of one of said receive signal path and said transmit signal path, wherein said duplex switch is disposed in said fourth cavity.

24. The system of claim 16, wherein said third cavity is a Faraday cage.

25. A method of providing a communication system circuit, said method comprising the steps of:

providing a plurality of cavities in a common conductive substrate, wherein at least two of said cavities are of a size and shape predetermined to provide desired wave propagation characteristics, and wherein ones of said at least two cavities provide a first wave propagation characteristic and other ones of said at least two cavities provide a second wave propagation characteristic; and disposing a microstrip transmission line within ones of said cavities, including a first cavity having said first wave propagation characteristic, to define a communication signal path, wherein said communication signal path defined by said microstrip transmission line includes at least one electrical discontinuity substantially traversing a second cavity having said second wave propagation characteristics.

26. The method of claim 25, wherein said first wave propagation characteristic includes attenuation of free space propagation of frequencies native to said circuit.

27. The method of claim 25, wherein said second wave propagation characteristic includes rejection of frequencies out of band of frequencies native to said circuit.

28. The method of claim 27, further comprising the step of:

tuning at least one of said cavities having said second wave propagation characteristic to provide a sharper cutoff of rejection of said frequencies.

29. The method of claim 28, wherein said tuning step comprises the step of:

associating a conductive material having openings of a predetermined size and placement with said at least one of said cavities.

30. The method of claim 25, wherein said communication signal path includes a transmit signal path portion and a receive signal path portion, further comprising the step of:

disposing a switching circuit in said communication signal path at a junction of said transmit signal path portion and said receive signal path portion.

31. The method of claim 30, further comprising the steps of:

disposing an amplifier circuit in said transmit signal path portion, wherein said transmit amplifier circuit is at least in part disposed within said first cavity; and disposing an amplifier circuit in said receive signal path portion, wherein said receive amplifier circuit is at least in part disposed within said first cavity.

32. The method of claim 31, wherein a component of said transmit amplifier circuit is disposed in a cavity, having said first wave propagation characteristic, intersecting said first cavity.

33. The method of claim 31, wherein a component of said receive amplifier circuit is disposed in a cavity, having said first wave propagation characteristic, intersecting said first cavity.

34. The method of claim 31, wherein said receive signal path portion includes said electrical discontinuity substantially traversing said second cavity having said second wave propagation characteristic, and wherein said transmit signal path portion includes an electrical discontinuity substantially traversing a third cavity having said second wave propagation characteristic, said method further comprising the step of:

disposing a mixing circuit in at least one of said receive signal path portion and said transmit signal path portion, wherein said mixing circuit is disposed in a portion of said signal path portion opposite said cavity having said second wave propagation characteristic from said switching circuit.

35. The method of claim 34, wherein said mixing circuit is at least in part disposed within a fourth cavity having said first wave propagation characteristic.

36. The method of claim 35, wherein first wave propagation characteristic as provided by said first cavity and said first wave propagation characteristic as provided by said fourth cavity are different.

37. The method of claim 36, wherein said first wave propagation characteristic as provided by said first cavity includes attenuation of free space propagation of a radio frequency native to said circuit; and wherein said first wave propagation characteristic as provided by said fourth cavity includes attenuation of free space propagation of an intermediate frequency native to said circuit.

38. A microwave front end time division duplex apparatus comprising:

a first conductive plate having a plurality of waveguides formed therein, wherein ones of the waveguides are tuned to pass different frequency bands;

a second conductive plate adapted to interface with said first conductive plate and to substantially enclose said plurality of waveguides;

a first circuit portion including a duplex switch circuit, a receive amplifier circuit, and a transmit amplifier circuit, wherein said first circuit portion is adapted to be disposed within at least a first waveguide of said plurality of waveguides, and wherein a receive section of said first circuit portion interfaces with a second waveguide of said plurality of waveguides adapted for providing bandpass filtering of a communicated signal, and wherein a transmit section of said first circuit portion interfaces with a third waveguide of said plurality of waveguides adapted for providing bandpass filtering of a communicated signal; and a second circuit portion including a receive mixer circuit, and a transmit mixer circuit, wherein said second circuit portion is adapted to be disposed within at least a fourth waveguide of said plurality of waveguides, wherein a receive section of said second circuit portion interfaces with said second waveguide, and wherein a transmit section of said second circuit portion interfaces with said third waveguide.

39. The apparatus of claim 38, wherein said second and third waveguides are substantially parallel and said first waveguide is substantially orthogonal to said second and third waveguides.

40. The apparatus of claim 39, wherein said first waveguide includes bends adapted to allow said first waveguide to abut an end of said second waveguide and an end of said third waveguide.

41. The apparatus of claim 38, wherein said fourth waveguide is adapted to reject frequencies to be conducted by said receive section and said transmit section of said second circuit portion.

42. The apparatus of claim 38, further comprising:

a third circuit portion including an oscillator, wherein said third circuit portion is adapted to be disposed within a cavity of said first conductive plate and to interface with said receive section and said transmit section of said second circuit portion.

43. The apparatus of claim 42, wherein said cavity is adapted to provide electric shielding when a conductive plate is interfaced with said first conductive plate.

44. The apparatus of claim 38, wherein said first circuit portion comprises:

a dielectric substrate; and a conductor disposed on said dielectric substrate, wherein when said first circuit portion is disposed within said first waveguide said conductor, said dielectric substrate, and a surface of said waveguide combine to form a microstrip transmission line.

45. The apparatus of claim 38, wherein said interface between said receive section of said first circuit portion and said second waveguide includes a capacitive coupling.

46. The apparatus of claim 38, wherein said interface between said transmit section of said first circuit portion and said third waveguide includes a capacitive coupling.

47. The apparatus of claim 38, wherein said interface between said receive section of said first circuit portion and said second waveguide includes an inductive link.

48. The apparatus of claim 38, wherein said interface between said transmit section of said first circuit portion and said third waveguide includes an inductive link.

49. The apparatus of claim 38, wherein said first waveguide is adapted to reject frequencies to be conducted by said receive section and said transmit section of said first circuit portion.

* * * * *